(12) United States Patent
Wong et al.

(10) Patent No.: US 7,410,882 B2
(45) Date of Patent: Aug. 12, 2008

(54) METHOD OF MANUFACTURING AND STRUCTURE OF POLYCRYSTALLINE SEMICONDUCTOR THIN-FILM HETEROSTRUCTURES ON DISSIMILAR SUBSTRATES

(75) Inventors: William S. Wong, San Carlos, CA (US); Jeng-Ping Lu, San Jose, CA (US); Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 150 days.

(21) Appl. No.: 10/950,452

(22) Filed: Sep. 28, 2004

(65) Prior Publication Data

US 2006/0068563 A1 Mar. 30, 2006

(51) Int. Cl.
*H01L 21/30* (2006.01)
(52) U.S. Cl. ............ 438/455; 438/149; 438/160; 438/459; 257/E29.295
(58) Field of Classification Search .......... 438/149, 438/160, 455, 459, 977, 458
See application file for complete search history.

(56) References Cited

U.S. PATENT DOCUMENTS 6,696,325 B1 * 2/2004 Tsai et al. .............. 438/149

2004/0178527 A1 * 9/2004 Liao et al. .............. 264/1.34

* cited by examiner

*Primary Examiner*—Alexander G Ghyka
(74) *Attorney, Agent, or Firm*—Oliff & Berridge, PLC

(57) ABSTRACT

According to various exemplary embodiments of this invention, a method of producing a semiconductor structure is provided that includes providing a layered structure on a first substrate, the layered structure including a silicon layer that is provided over a first dielectric layer, a first dielectric layer that is provided over an etch-stop layer, the etch-stop layer provided over a buffer layer, the buffer layer provided over a sacrificial layer, and a sacrificial layer provided over a first substrate. Moreover, various exemplary embodiments of the methods of this invention provide for a second substrate over the layered structure, separating the first substrate and the sacrificial layer from the buffer layer, separating the buffer layer and the etch-stop layer from the first dielectric layer and providing a drain electrode and a source electrode over the layered structure. Moreover, according to various exemplary embodiments of the devices of this invention, a transistor device is provided that includes a substrate, a gate electrode over the substrate, a laser recrystallized polycrystalline semiconductor layer over the gate electrode and a source electrode and a drain electrode over the laser recrystallized polycrystalline semiconductor. Finally, according to various exemplary embodiments of the devices of this invention, a transistor device is provided that includes a substrate, a laser recrystallized polycrystalline semiconductor over the substrate, a source electric and a drain electrode over the laser recrystallized polycrystalline semiconductor and a gate electrode over the source electrode and the drain electrode.

24 Claims, 12 Drawing Sheets

METHOD OF MANUFACTURING AND STRUCTURE OF POLYCRYSTALLINE SEMICONDUCTOR THIN-FILM HETEROSTRUCTURES ON DISSIMILAR SUBSTRATES

This invention was made with U.S. Government support awarded under the Advance Technology Program (ATP) of the National Institute of Standards and Technology (NIST). The U.S. Government has certain rights in this invention, including the right in limited circumstances to require the patent owner to license others on reasonable terms as provided for by the terms of Contract No. 70NANB0H3033.

BACKGROUND OF THE INVENTION

1. Field of Invention

This invention relates to the manufacture of semiconductor thin-film, and more particularly to polycrystalline semiconductor thin-films formed on dissimilar substrates.

2. Description of Related Art

In general, polycrystalline thin-film transistors are fabricated on substrates that are capable of withstanding high temperature processes such as, for instance, processes that take place at temperatures higher than 500° C. However, unlike traditional amorphous silicon thin-film transistors, poly-silicon devices usually perform best only when a silicon oxide gate dielectric is used. Silicon oxide of high quality is generally obtained through a deposition process that takes place at high temperature, which precludes the use of substrate materials, on which the silicon oxide is deposited, that have low melting or decomposition temperatures or that would not withstand high temperatures. These substrates are, for instance, plastic substrates.

Accordingly, the conventional method of manufacturing polycrystalline silicon thin-film transistors on materials that do not withstand high temperatures such as, for instance, flexible materials or plastic platforms, generally involves using low temperature deposition process in order to deposit amorphous silicon, which is later re-crystallized in order to form polycrystalline silicon using, for instance, localized laser irradiation. The silicon oxide gate dielectric is then deposited on the flexible plastic platform using a low temperature deposition process. However, thin-film transistors formed in this manner generally exhibit poor performance because of the poor dielectric properties of the transistor.

SUMMARY OF THE INVENTION

In light of the above described problems and shortcomings, various exemplary embodiments of the systems and methods according to this invention provide for a method of producing an inverted semiconductor structure that includes at least providing a layered structured on a first substrate, the layered structure includes a silicon layer, a sacrificial layer, a buffer layer, an etch-stop layer, a first dielectric layer, a second dielectric layer and a gate electrode. The method also includes providing a second substrate over the layered structure, separating the first substrate from the layered structure and providing a drain electrode and a source electrode over the layered structure.

According to various exemplary embodiments of the systems and methods of this invention, the method further includes providing the sacrificial layer over the first substrate, providing the buffer layer over the sacrificial layer, providing the etch-stop layer over the buffer layer, providing the first dielectric layer over the etch-stop layer and providing the silicon layer over the first dielectric layer.

According to other exemplary embodiments of this invention, the above-described method further includes recrystallizing the silicon layer, providing the second dielectric layer over the silicon layer, providing a patterned metal layer over the second dielectric layer, the patterned metal layer defining at least the gate electrode, defining at least a source region and at least a drain region in the second dielectric layer on each side of the gate electrode and annealing the layered structure.

Moreover, according to various exemplary embodiments of the systems and methods of this invention, the above-described method alternatively provides for recrystallizing the silicon layer, providing a second dielectric layer over the silicon layer, providing a patterned metal layer over the second dielectric layer, the patterned metal layer defining at least a gate electrode and annealing the layered structure, then patterning a photoresist etch mask to self-align source and drain contact vias with gate electrodes, etching the second dielectric to form the vias to expose the source and drain regions of the silicon layer, providing doping layer over the exposed silicon layer to define the source region and the drain region, removing the patterned photoresist, anneal the doping layer, and providing a patterned source electrode and drain electrode over at least a portion of the source region and over at least a portion of the drain region, respectively. According to various exemplary embodiments, a final hydrogenation step is used to passivate the thin film device structure.

Furthermore, various exemplary embodiments of the methods of this invention also provide for annealing the silicon layer, providing a second dielectric layer over the silicon layer and providing a bonding layer over the second dielectric layer, providing the second substrate over the bonding layer, separating the first substrate, removing the exposed buffer layer and the etch-stop layer after performing laser irradiation through the transparent first substrate, the absorption of the laser light by the sacrificial layer decomposes the sacrificial layer to allow separation of the first substrate. After removing the first substrate and sacrificial layer, various exemplary embodiments of the methods of this invention also provide for performing laser recrystallization of the first dielectric layer, patterning a gate electrode to self-align source and drain contact vias the gate electrode, etching the vias to expose the source and drain regions of the silicon layer, defining a source region and drain region on the silicon layer, providing a source electrode and a drain electrode over the source region and drain region respectively and performing a low temperature hydrogenation step.

According to various exemplary embodiments of the devices of this invention, this invention provides for a transistor device that includes at least a substrate, a gate electrode over the substrate, a laser recrystallized polycrystalline semiconductor over the gate electrode and a source electrode and a drain electrode over the laser recrystallized polycrystalline semiconductor.

Finally, according to various exemplary embodiments of the devices of this invention, this invention provides for a transistor device that includes at least a substrate, a laser recrystallized polycrystalline semiconductor over the substrate, a source electrode and a drain electrode over the laser recrystallized polycrystalline semiconductor and a gate electrode over the source electrode and the drain electrode, wherein the substrate is a second substrate over which the gate electrode, the laser recrystallized polycrystalline semiconductor, the source electrode and the drain electrode have been transferred after having been formed on a first substrate.

BRIEF DESCRIPTION OF THE DRAWINGS

Various exemplary embodiments of the systems and methods of this invention will be described in detail, with reference to the following figures, wherein.

DETAILED DESCRIPTION OF PREFERRED EMBODIMENTS

These and other features and advantages of this invention are described in, or are apparent from, the following detailed description of various exemplary embodiments of the systems and methods according to this invention.

Figure 1:
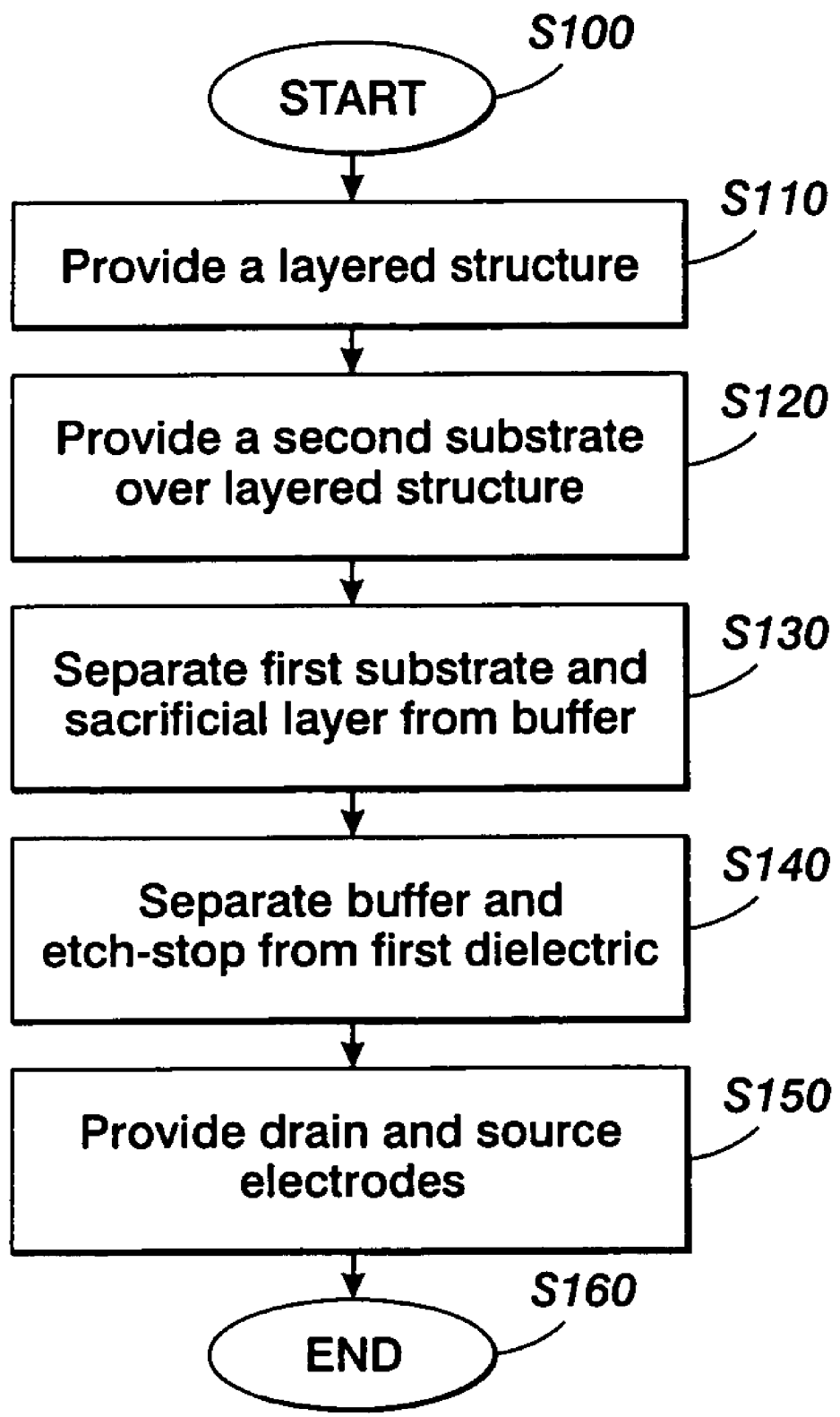
FIG. 1 is a flowchart illustrating the manufacturing method of a polycrystalline thin-film transistor according to various exemplary embodiments of this invention.

FIG. 1 is a flowchart illustrating the manufacturing method of a polycrystalline thin film transistor according to various exemplary embodiments of this invention. The method starts in step S100 and continues to step S110 during which a layered structure is provided. According to various exemplary embodiments of the methods of this invention, the layered structure comprises a first substrate over which a sacrificial layer is provided, a buffer layer is provided over the sacrificial layer, an etch-stop layer is provided over the buffer layer, a first dielectric layer is provided over the etch stop layer and an amorphous silicon layer is provided over the first dielectric layer. Moreover, according to various exemplary embodiments of this invention, the amorphous silicon layer is then laser annealed in order to recrystallize the amorphous silicon layer and transform it into a polycrystalline silicon layer. Also, during step S110 and according to various exemplary embodiments, a second dielectric layer is provided over the recrystallized silicon layer and a patterned metal electrode is provided over the second dielectric layer. Moreover, according to various exemplary embodiments of this invention, ion implantation is carried out on the semiconductor layer through the second dielectric layer in order to define a source region and a drain region on each side of the patterned metal electrode. Next, control continues to step S120.

According to various exemplary embodiments, the layered structure is further annealed in order to remove any structural damage possibly present, and to hydrogenate the polycrystalline layer. According to various exemplary embodiments, annealing is performed at about 500° C.

During step S120, a second substrate is provided over the layered structure that is provided during step S110. When the second substrate is provided over the patterned metal during step S120, control continues to step S130. During step S130, the first substrate and the sacrificial layer are separated from the buffer layer by decomposition of the sacrificial layer. According to various exemplary embodiments, the decomposition of the sacrificial layer is achieved through laser irradiation of the sacrificial layer through a transparent first substrate. According to various exemplary embodiments, the first substrate and the sacrificial layer are separated from the buffer/substrate interface by laser lift off. Moreover, according to various exemplary embodiments of this invention, when the first substrate and the sacrificial layer are separated from the buffer, the layered structure bonded to the second substrate is inverted during step S130. Next, control continues to step S140.

During step S140, the buffer layer and the etch-stop layer are removed to expose the first dielectric layer by selective etching. According to various exemplary embodiments, the buffer layer is etched down to the etch stop layer, then the etch stop layer is etched down to the first dielectric layer, thus exposing the first dielectric layer. According to various exemplary embodiments, the first dielectric layer is a silicon oxide dielectric layer.

After the buffer layer and the etch-stop layer are etched down during step S140, control continues to step S150. During step S150, a patterned photoresist is provided over the first dielectric layer. According to various exemplary embodiments, the patterned photoresist is designed to be self-aligned to the patterned metal electrode provided earlier during step S110. Moreover, during step S150, the portion of the first dielectric layer that is not covered by the patterned photoresist is etched down to the polycrystalline silicon layer. Also, during step S150 and according to various exemplary embodiments, a source metal electrode and a drain metal electrode are deposited over the source region and drain region respectively that were defined during step S110. Next, when the drain and the source electrodes are provided during step S150, control continues to step S160, where the method ends.

According to various alternative embodiments, a third substrate is provided over a surface of the layered structure opposite the second substrate, and the second substrate is removed from the thin film structure during step S150.

Figure 2:
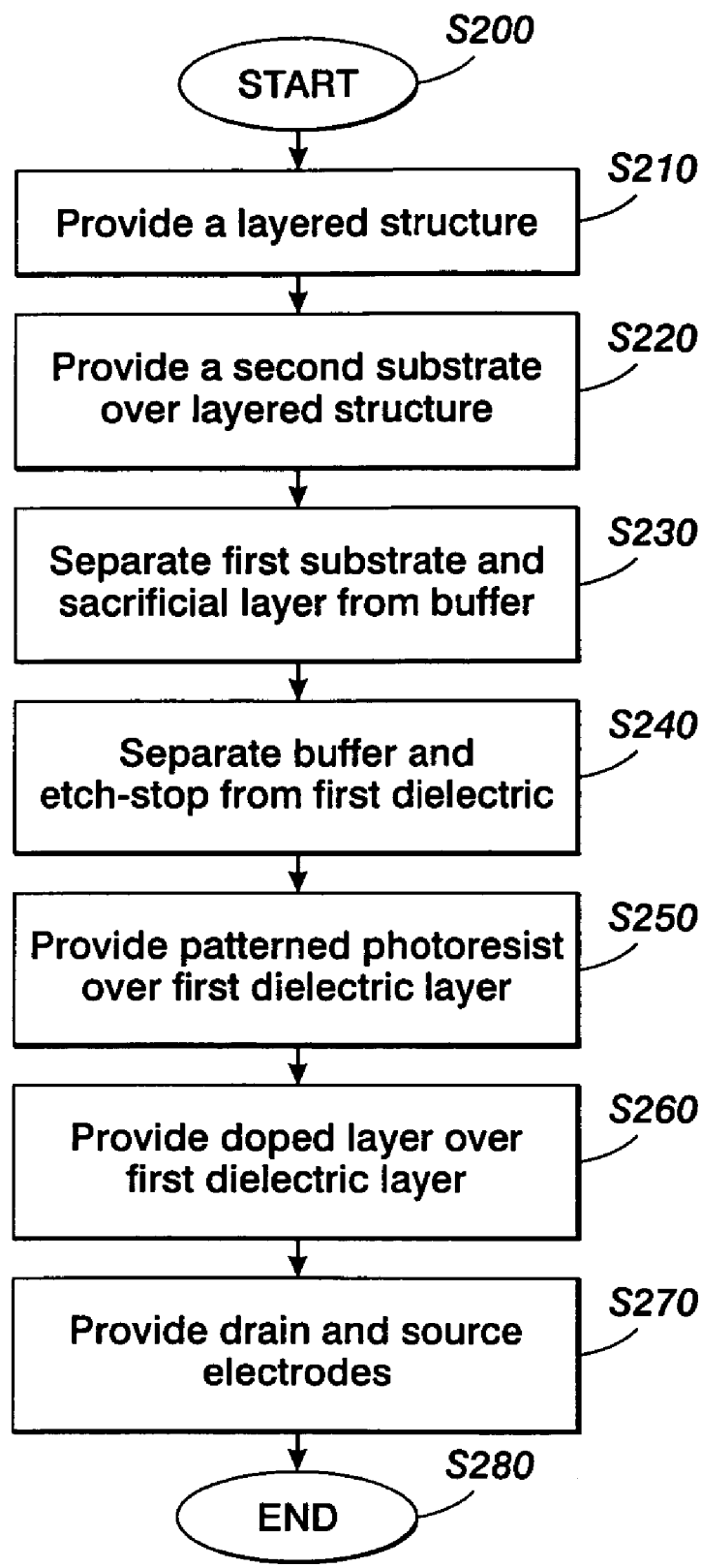
FIG. 2 is a flowchart illustrating a manufacturing method of a polycrystalline thin-film transistor according to various exemplary embodiments of this invention.

FIG. 2 is a flowchart illustrating a manufacturing method of a polycrystalline thin film transistor according to various exemplary embodiments of this invention. The method starts in step S200, and continues to step S210 during which a layered structure is provided. According to various exemplary embodiments, the layered structure includes a first substrate over which a sacrificial layer is provided. A buffer layer is then provided over the sacrificial layer, an etch-stop layer is provided over the buffer layer, a first dielectric layer is provided over the etch-stop layer and an amorphous silicon layer is provided over the first dielectric layer, according to various exemplary embodiments of this invention. Then, according to various exemplary embodiments, the amorphous silicon layer is annealed with a laser in order to re-crystallize the amorphous structure and form a layer of polycrystalline silicon. When the polycrystalline silicon layer is provided, a second dielectric layer is provided over the polycrystalline silicon layer, and a patterned metal is provided over the second dielectric layer. Next, control continues to step S220.

In step S220, a second substrate is provided over the layered structure provided during step S210. As such, according to various exemplary embodiments, the second substrate is provided over the patterned metal. Next, control continues to step S230, where the first substrate and the sacrificial layer are separated from the buffer layer. According to various exemplary embodiments of the methods of this invention, the first substrate and the sacrificial layer are separated from the buffer layer via thermal decomposition of the sacrificial layer induced through laser irradiation.

Next, control continues to step S240, during which the buffer layer and the etch-stop layer are removed from the first dielectric layer. According to various exemplary embodiments, the buffer layer and the etch stop layer are etched down in order to uncover the first dielectric layer. According to various exemplary embodiments, the first dielectric layer is a silicon dioxide dielectric layer.

Next, control continues to step S250, during which a patterned photoresist is provided over the first dielectric layer. According to various exemplary embodiments, the patterned photoresist is provided so as to self-align with the patterned metal provided earlier during step S210.

Following step S250, control continues to step S260, during which a layer of doped silicon or phosphorous nitride is provided over the exposed portions of the first dielectric layer. According to various exemplary embodiments, providing a doped layer over the exposed portions of the first dielectric layer defines a source region and a drain region.

Next, control continues to step S270. During step S270, the patterned photoresist provided during step S250 is removed from the first dielectric layer. According to various exemplary embodiments, the patterned photoresist is removed by stripping. Then, source and drain contacts or electrodes are defined through mask liftoff and are self-aligned to the patterned metal earlier provided during step S210. A source metal layer and a drain metal layer are then deposited and patterned over the source region and the drain region, respectively, during step S270. According to various exemplary embodiments, the structure is then hydrogenated to passivate dangling bonds in the various layers. Next, control continues to step S280, where the method ends.

According to various alternative embodiments, a third substrate is provided over a surface of the layered structure opposite the second substrate, and the second substrate is removed from the thin film structure during step S270.

Figure 3:
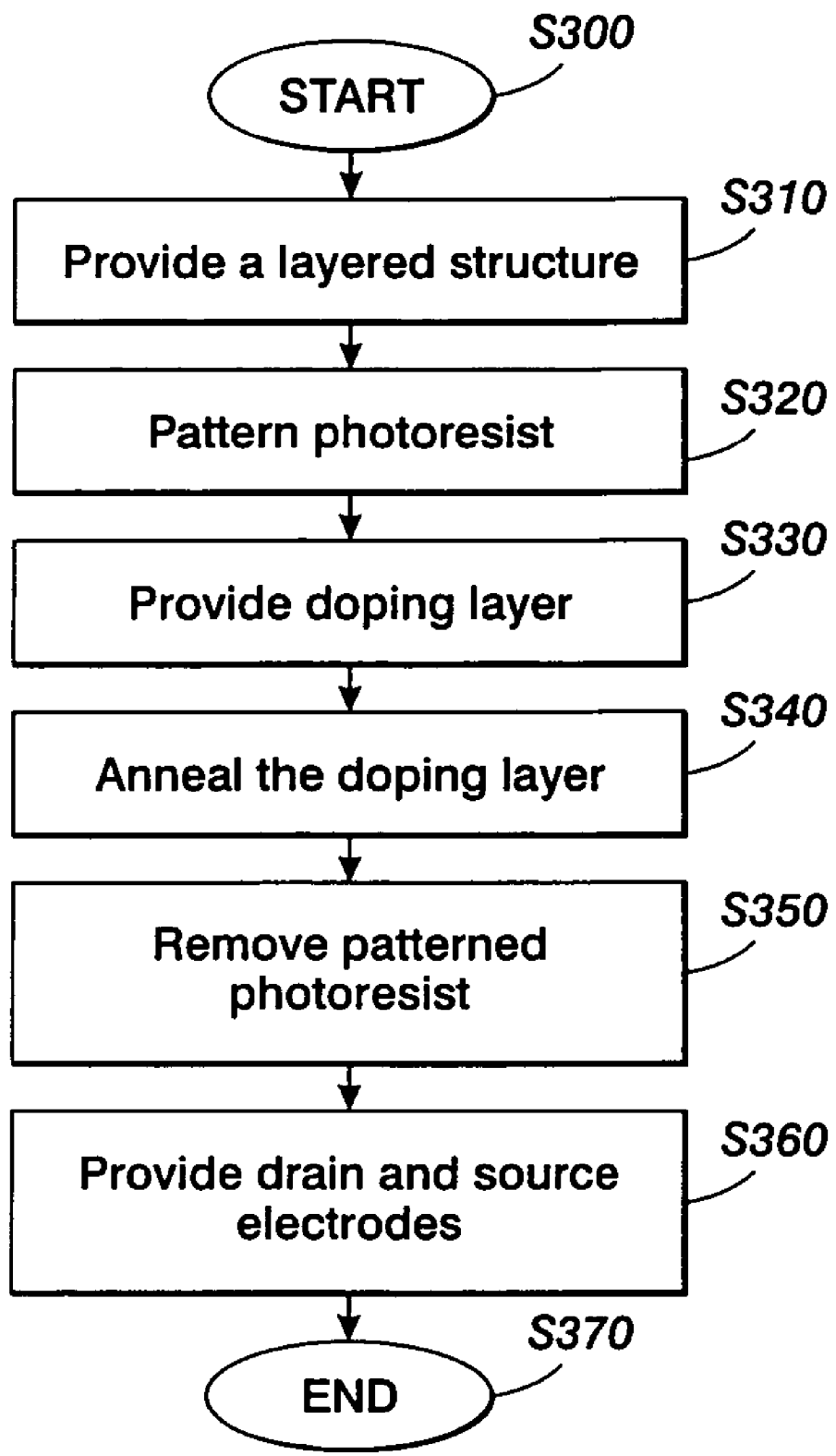
FIG. 3 is a flowchart illustrating a manufacturing method of a thin-film transistor according to various exemplary embodiments of this invention.

FIG. 3 is a flowchart illustrating a manufacturing method of a thin-film transistor according to various exemplary embodiments of this invention. The method starts in step S300 and continues to step S310. During step S310, a layered structure is provided which includes a first substrate upon which a sacrificial layer is provided. A buffer layer is provided over the sacrificial layer, an etch-stop layer is provided over the buffer layer, a first dielectric layer is provided over the etch-stop layer and an amorphous silicon layer is provided over the first dielectric layer. Also, during step S310, the amorphous silicon layer is laser recrystallized in order to transform it into a layer of polycrystalline silicon, then a second dielectric layer is provided over the recrystallized silicon layer, and a patterned metal layer is provided over the second dielectric layer. According to various exemplary embodiments, the layered structure is then annealed. Next, control continues to step S320.

During step S320, a photoresist is provided over the layered structure provided during step S310 and is patterned in order to allow self alignment of source and drain contacts with the patterned metal layer. Next, control continues to step S330. At step S330, a doping layer is provided over any exposed portion of the silicon layer that is not covered by the patterned photoresist in order to define a source region and a drain region. Next, control continues to step S340, where the doped layer is annealed. Next, control continues to step S350, during which the patterned photoresist is removed. According to various exemplary embodiments, the patterned photoresist is removed by etching. Next, control continues to step S360, where a source electrode and a drain electrode are provided over the source region and the drain region respectively. Next, control continues to step S370, where the method ends.

Figure 4:
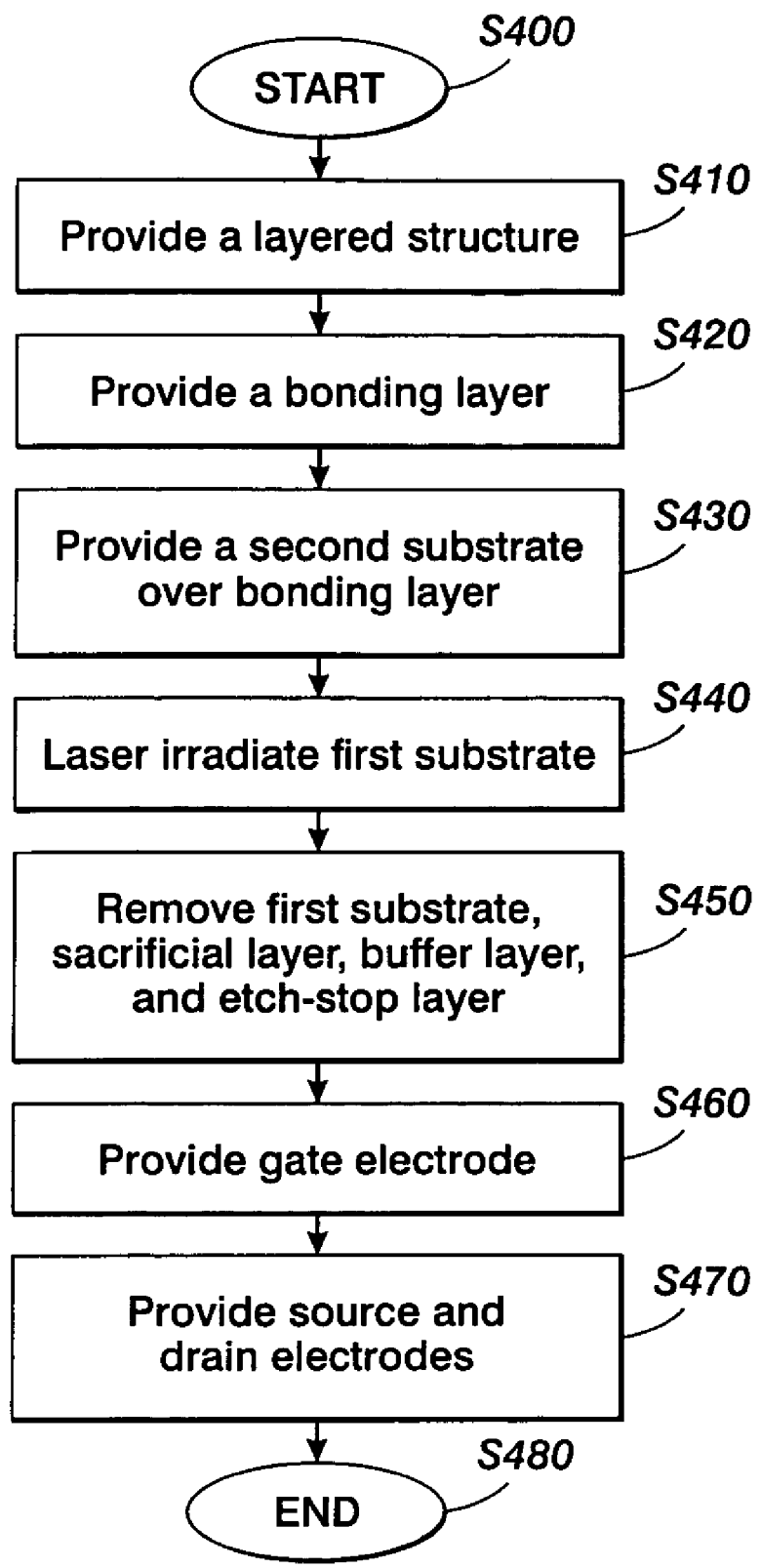
FIG. 4 is a flowchart illustrating a method of manufacturing a thin-film transistor according to various exemplary embodiments of this invention.

FIG. 4 is a flowchart illustrating a method of manufacturing a thin-film transistor according to various exemplary embodiments of this invention. The method starts in step S400 and continues to step S410 during which a layered structure is provided. According to various exemplary embodiments, the layered structure includes a first substrate over which a sacrificial layer is provided. A buffer layer is provided over the sacrificial layer, an etch-stop layer is provided over the buffer layer, a first dielectric layer is provided over the etch-stop layer and an amorphous layer is provided over the first dielectric layer. According to various exemplary embodiments, the amorphous layer is an amorphous silicon layer. When the layered structure is provided, according to various exemplary embodiments, the amorphous silicon layer is annealed. According to various exemplary embodiments, the amorphous silicon layer is laser recrystallized in order to transform the amorphous silicon layer into a polycrystalline silicon layer. When the amorphous silicon layer is annealed during step S410, then a second dielectric layer is provided over the recrystallized silicon layer. Next, control continues to step S420.

During step S420, a bonding layer is provided over the second dielectric layer. Next, control continues to step S430, during which a second substrate is provided over the bonding layer. Next, control continues to step S440.

During step S440, the sacrificial layer is irradiated through the first substrate is by laser light in order to decompose the sacrificial layer and facilitate the removal of the first substrate. Next, control continues to step S450. During step S450, the first substrate, the sacrificial layer, the buffer layer and the etch stop layer are removed. According to various exemplary embodiments, these layers are removed via laser lift off or by selective wet chemical etching. Next, control continues to step S460. During step S460, and according to various exemplary embodiments, the layered structure is inverted and the semiconductor layer is recrystallized via a laser. According to various exemplary embodiments, a gate electrode is patterned over the first dielectric layer during step S460. Next, control continues to step S470.

During step S470, the portions of the first dielectric layer that are not covered by the patterned gate electrode are removed down to the polycrystalline silicon layer. According to various exemplary embodiments, the first dielectric layer is removed by etching. According to various exemplary embodiments, a source region and a drain region are defined over the exposed polycrystalline silicon layer during step S470, and a source electrode and a drain electrode are provided over the source region and the drain region respectively. According to various exemplary embodiments, a low temperature hydrogenation step is also performed during step S470. Next, control continues to step S480, where the method ends.

According to various alternative embodiments, a third substrate is provided over a surface of the layered structure opposite the second substrate, and the second substrate is removed from the thin film structure during step S470.

Figure 5A:
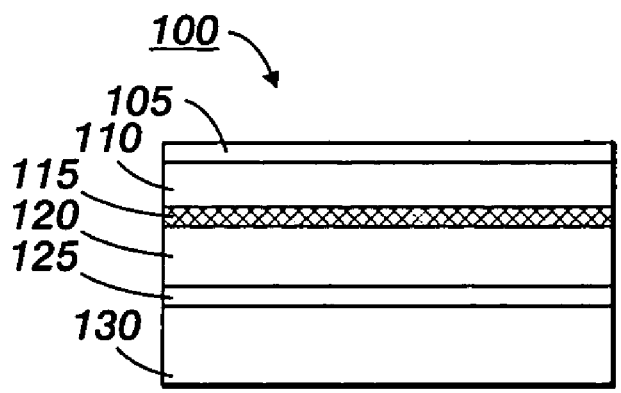
FIGS. 5a-5k are schematic representations of the different structural steps of manufacturing a thin-film transistor according to various exemplary embodiments of this invention.

FIGS. 5a-5k are schematic representations of the different structural steps of manufacturing a thin-film transistor according to various exemplary embodiments of this invention. According to various exemplary embodiments, a process wafer made of a material capable of high temperature processing is used as a substrate 130 for deposition and fabrication of a poly-crystalline semiconductor-based thin-film transistor device heterostructure 100, as illustrated in FIG. 5a. The heterostructure, according to various exemplary embodiments, includes a Si layer 105, and a dielectric insulator 110 such as, for instance, $SiO_2$. The properties for the process wafer typically include high-melting point and high-decomposition temperatures (>600° C.), rigid at high temperatures. Moreover, the process wafer is semiconductor device processable, and these requirements are generally not compatible with typical low-cost, conformable materials such as plastic or flexible substrate materials that require low-temperature processing (<300° C.).

According to various exemplary embodiments, the layer transfer process, i.e., the removal of the first substrate and the transfer of the layered structure to a second substrate, uses a sacrificial layer to separate the processed layered structure from its growth wafer, which is the first substrate 130. According to various exemplary embodiments, the criteria for the sacrificial layer 125 may include high decomposition temperature, absorbing in ultra-violet (UV) light, and compatibility with Si-based device processing. Candidate materials for the sacrificial layer include, for example, a-Si:H, indium-tin oxide, and phosphorous-doped a-Si:H. Other materials may include GaN, zinc oxide and lead-zirconium titanate as well as other materials.

The layered heterostructure, which includes a sacrificial layer 125/buffer layer 120/semiconductor layer 105/dielectric layer 110 stack and which is formed on the original substrate 130, possesses features that optimize the laser-assisted layer transfer process. According to various exemplary embodiments, the original growth and processing substrate 130 is transparent to the laser irradiation source. Also, the buffer layer 120 is a passive layer used to maintain a minimum thickness in order to eliminate the possibility of microcracks in the thin film due to the laser processing. A typical buffer layer 120 thickness is estimated to be between 3-10 microns.

Figure 5B:
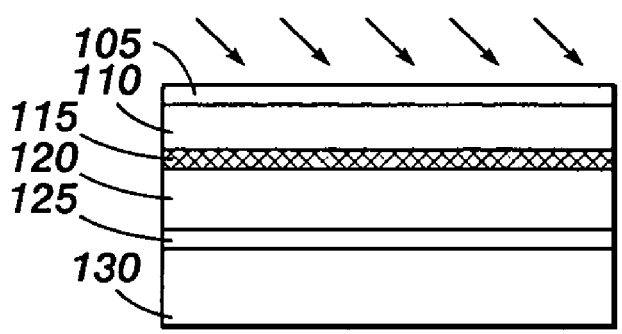
Figure 5C:
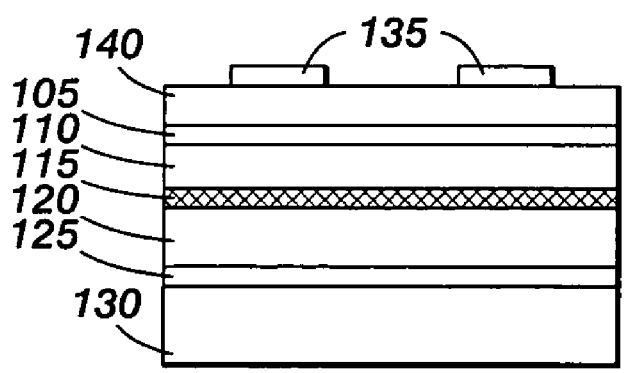

In combination with the thin etch-stop layer 115 introduced during the deposition of the heterostructure, post-liftoff and transfer processing can also be used to create novel heterostructures. According to various exemplary embodiments, a structure can be provided by first depositing a sacrificial layer 125 on a first substrate 130. A thick buffer layer 120 such as, for instance, oxynitride, is deposited next followed by a thin etch-stop layer 115 such as, for instance, amorphous Si. Following the etch-stop layer 115, a high temperature dielectric layer 110 such as, for instance, a $SiO_2$ dielectric layer, is deposited onto the etch stop layer 115, and finally the amorphous Si active layer 105 is deposited over the dielectric layer 110. According to various exemplary embodiments, the top Si layer 105 is then recrystallized using a laser annealing process, as illustrated in FIG. 5b. According to various exemplary embodiments, a second dielectric layer 140 is then deposited onto the recrystallized polycrystalline Si layer 105, as illustrated in FIG. 5c. According to various exemplary embodiments, the metal gate layer 135 is deposited and patterned to form a top-gate structure on the original growth substrate followed by an ion-implantation step to define the source and drain regions, as also illustrated in FIG. 5a. According to various exemplary embodiments, the whole structure is then annealed to remove implant damage and hydrogenated to passivate the dielectric and semiconductor layer.

Figure 5D:
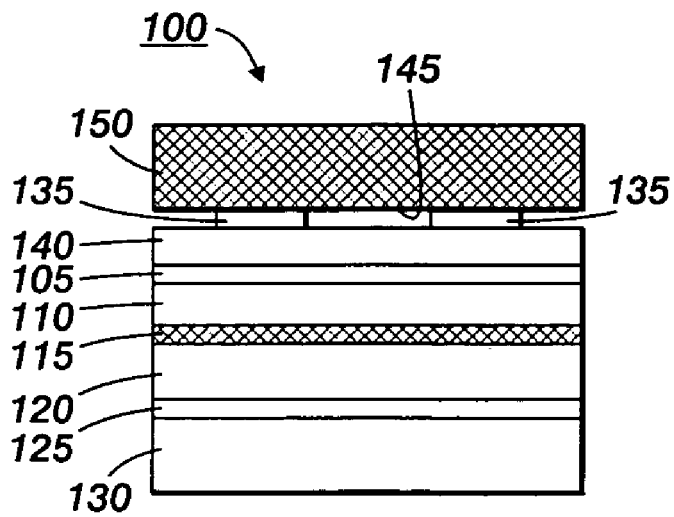
Figure 5E:
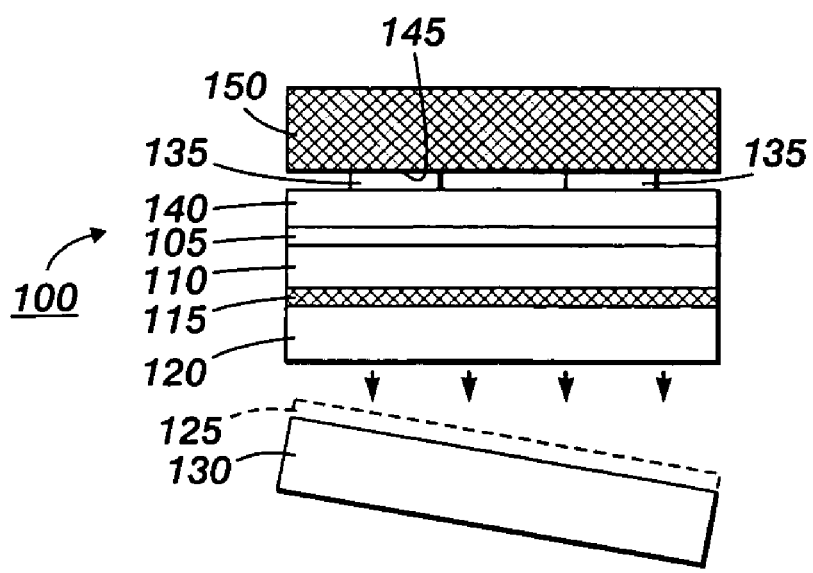
Figure 5F:
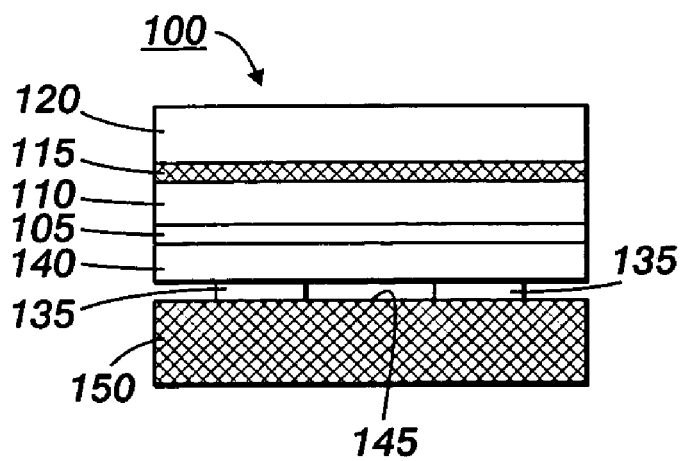
Figure 5G:
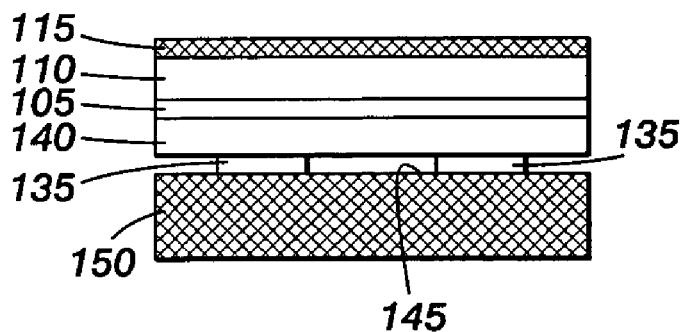
Figure 5H:
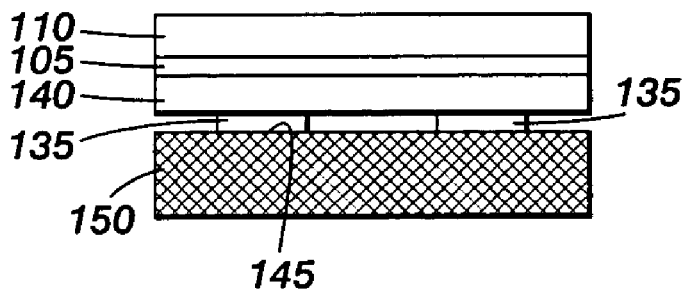
Figure 5I:
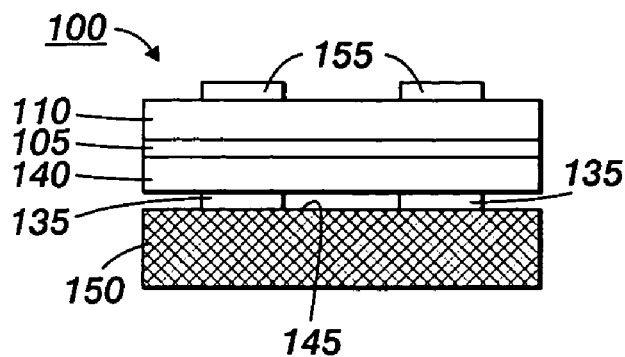
Figure 5J:
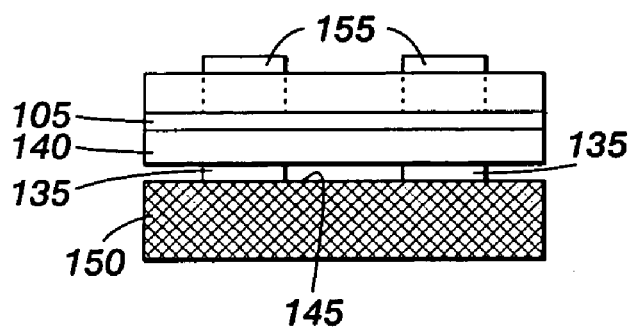
Figure 5K:
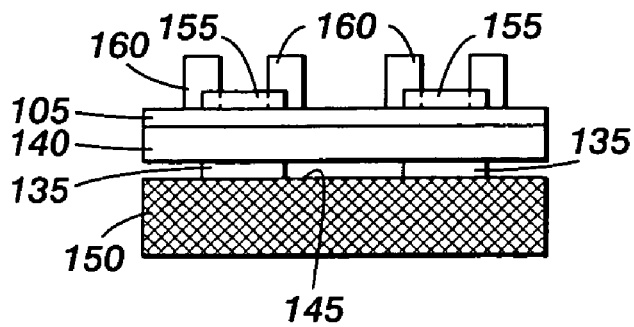

According to various exemplary embodiments, the heterostructure 100 is then bonded onto a substrate of choice such as, for example, the second substrate 150 via a bonding layer 145, as illustrated in FIG. 5d, and the layer transfer process is performed through laser lift-off, as illustrated in FIG. 5e. According to various exemplary embodiments, the transferred structure is inverted, thus creating a bottom gate configuration, as illustrated in FIG. 5f. According to various exemplary embodiments, the buffer layer 120 is etched down to the etch-stop layer 115 to complete the device structure on the new substrate 150, as illustrated in FIGS. 5g and 5h. A photoresist 155 is then patterned by, for instance, backside exposure, to self-align source and drain contact vias with the gate, as illustrated in FIG. 5i. Vias are then etched down to the semiconductor region to allow contact to the source and drain regions, as illustrated in FIG. 5j. According to various exemplary embodiments, source and drain electrodes 160 are then provided over the source and drain regions, and the resulting structure is in a bottom-gate geometry fabricated using a top gate processing configuration, as illustrated in FIG. 5k.

According to various exemplary embodiments, a variation to the source and drain doping can be performed at this step if the initial ion implantation is omitted. For instance, before stripping the photoresist etch mask, a layer of doped Si, or of phosphorous nitride, is deposited onto the exposed portions of the Si layer. The photoresist mask is then stripped and source and drain contacts are defined through mask liftoff, and are self-aligned to the gate because the photoresist was patterned using the existing gate electrode as the photo mask. Finally, source and drain metal is deposited over the source region and the drain region, respectively, and patterned to finish the device. According to various exemplary embodiments, separate vias are also etched to allow contact to the gate metal and isolation of the transistors. Accordingly, high-performance polycrystalline Si-based TFT devices can be integrated onto a variety of different substrate materials. According to various exemplary embodiments, the layer transfer approach to integration combines optimized high-temperature thin-film growth and processing with low-melting point materials. Accordingly, this method provides flexibility for isolating high-temperature processing on one platform with subsequent low-temperature processing on a new platform after layer transfer of the high-temperature material.

According to various exemplary embodiments, a high-performance device (measured carrier mobility>100 $cm^2/Vs$) with an inverted structure, i.e., a bottom gate configuration, requires laser recrystallization through the substrate during processing, which is unlikely given the laser fluence required, or a layer transfer process, as described in the exemplary embodiment of this invention.

According to various exemplary embodiments, the transfer process can also be accomplished using an intermediate handle wafer. The result is to invert the transferred heterostructure onto its new platform, maintaining the original orientation of the device structure. In this process, the highly doped source and drain regions are defined after the transfer process is complete. According to various exemplary embodiments, a phosphorous doped Si layer or a phosphorous nitride layer can be deposited to create the doped source and drain regions. According to various exemplary embodiments, the subsequent annealing and hydrogenation steps are performed at temperatures that are compatible with the new substrate.

Figure 6A:
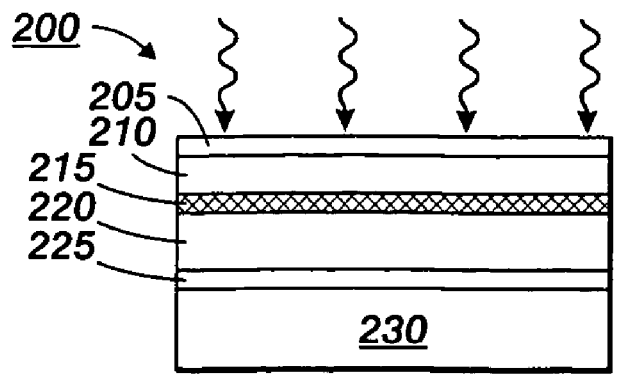
FIGS. 6a-6j are schematic representations of the different structural steps of manufacturing a thin-film transistor according to various exemplary embodiments of this invention.

FIGS. 6a-6j are schematic representations of the different structural steps of manufacturing a thin-film transistor according to various exemplary embodiments of this invention. FIGS. 6a-6j illustrate another exemplary embodiment of the present invention, which includes performing the laser recrystallization through the gate dielectric after transfer. According to various exemplary embodiments, the layered structure 200 includes a first substrate 230, a sacrificial layer 225 provided over the first substrate 230, a buffer layer 220 provided over the sacrificial layer 225, an etch-stop layer 215 provided over the sacrificial layer 225, a first dielectric layer 210 provided over the etch-stop layer 215 and an amorphous silicon layer 205 provided over the first dielectric layer 210, as illustrated in FIG. 6a.

Figure 6B:
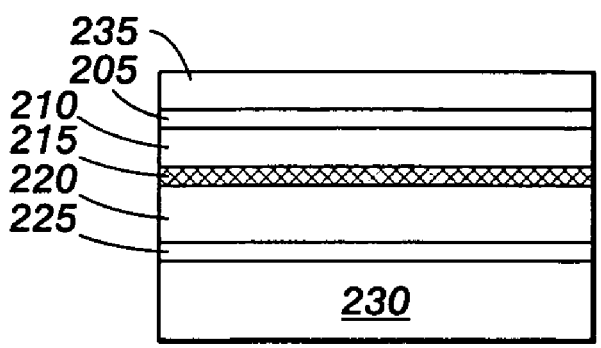
Figure 6C:
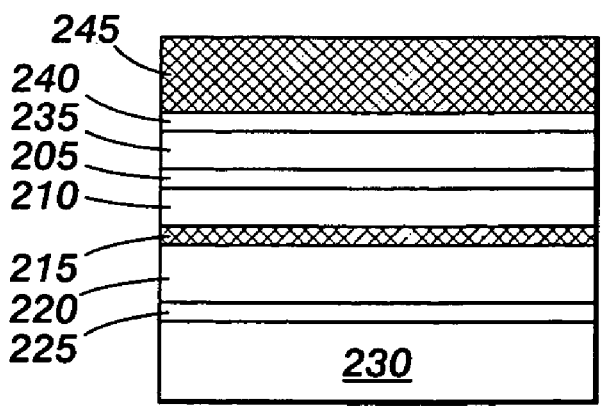

According to various exemplary embodiments, the amorphous silicon layer 205 is first de-hydrogenated via laser irradiation, then a second recrystallization laser annealing of the amorphous silicon layer 205 is performed and a second dielectric layer 235 is provided over the recrystallized silicon layer 205, as illustrated in FIG. 6b. According to various exemplary embodiments, the first laser annealing of the amorphous silicon layer 205 allows to remove hydrogen from the hydrogenated amorphous silicon layer 205, in order to permit a subsequent recrystallization by the second laser annealing of the amorphous silicon layer 205 into a recrystallized silicon layer. According to various exemplary embodiments, the first laser annealing is necessary to remove hydrogen from the amorphous silicon layer 205 because a high hydrogen content may out-diffuse from the amorphous silicon layer 205 and create cracking because of pressure built up inside the silicon layer 205. A bonding layer 240 is then provided over the second dielectric layer 235, and a second substrate 245 is provided over the bonding layer 240, as illustrated in FIG. 6c.

Figure 6D:
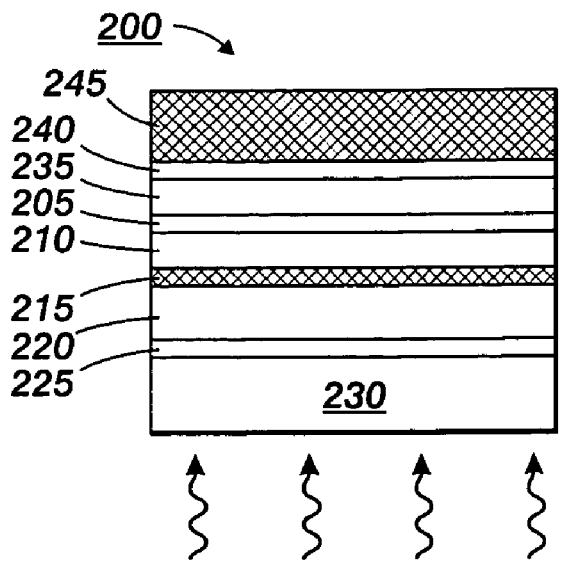
Figure 6E:
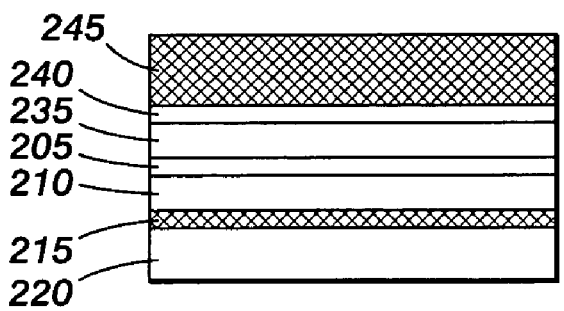
Figure 6F:
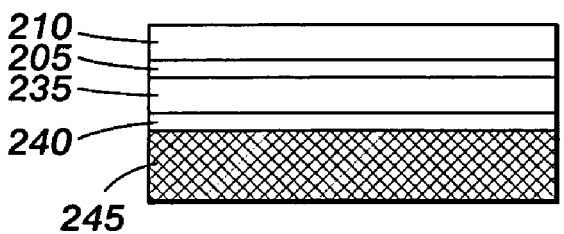

According to various exemplary embodiments, the layered structure 200 is separated from the growth substrate through selective laser processing of the sacrificial layer, as illustrated in FIG. 6d, in order to decompose and separate the sacrificial layer 225 and the first substrate 230 from the remainder of the layered structure 200, as illustrated in FIG. 6e. Also, according to various exemplary embodiments, and as illustrated in FIG. 6f, the layered structure 200 is inverted so that the second substrate 245 is positioned at the bottom of the layered structure 200.

Figure 6G:
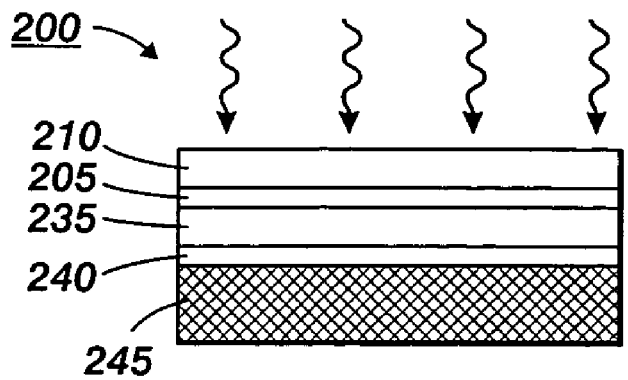
Figure 6H:
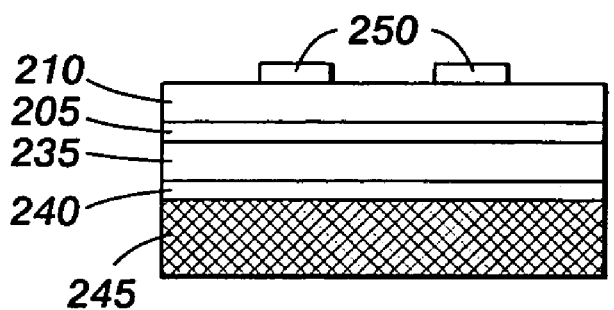
Figure 6I:
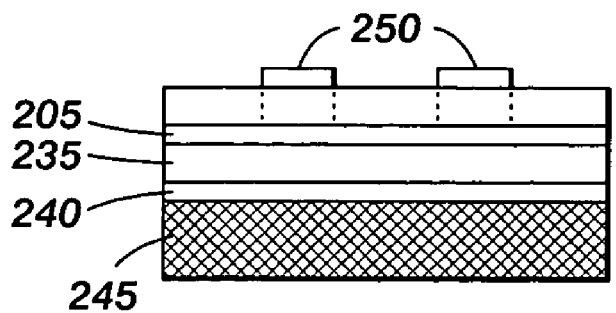
Figure 6J:
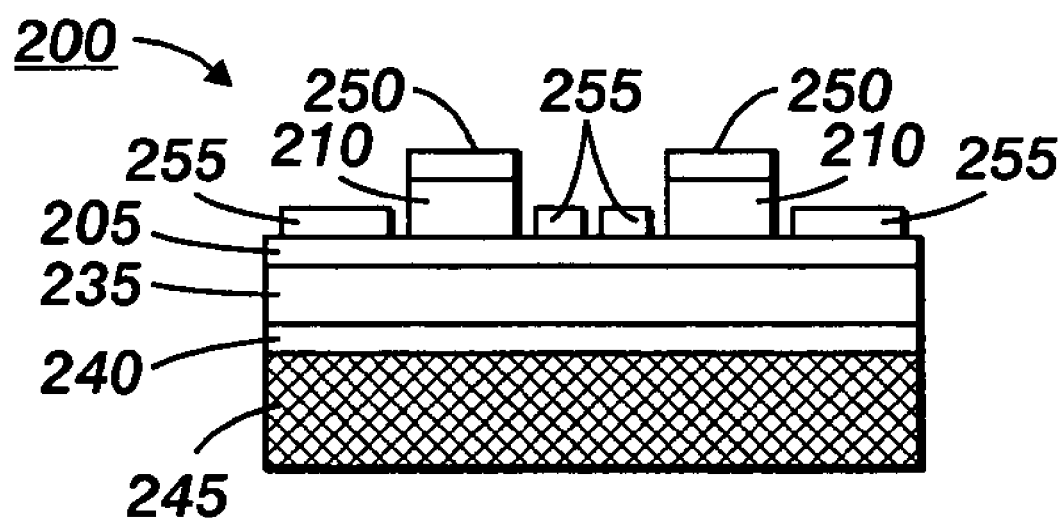

According to various exemplary embodiments, the inverted layered structure 200 is annealed via laser in order to recrystallize the amorphous silicon layer 205 through the first dielectric layer 210, as illustrated in FIG. 6g. A patterned gate layer 250 is also provided over the first dielectric layer 210, as illustrated in FIG. 6h, and the portions of the first dielectric layer 210 that are not covered by the patterned gate layer 250 are removed via etching, according to various exemplary embodiments, as illustrated in FIGS. 6i and 6j. Finally, a source and a drain electrode 255 are provided over the recrystallized silicon layer 205, and the resulting semiconductor structure exhibits a coplanar configuration, as illustrated in FIG. 6j.

Although a dehydrogenation anneal after the amorphous silicon layer 205 (a-Si:H) deposition is performed to allow subsequent laser annealing, according to various exemplary embodiments, a low-temperature hydrogenation step is performed after the device is completed.

While the invention has been described in conjunction with exemplary embodiments, these embodiments should be viewed as illustrative, not limiting. Various modifications, substitutes, or the like are possible within the spirit and scope of the invention.

What is claimed is:

1. A method of producing a thin film structure, comprising:
   providing a layered structure on a first substrate, the first substrate being transparent to photon irradiation, the layered structure comprising a first layer and a second layer, the second layer being substantially thicker than the first layer;
   providing a second substrate comprising a buffer layer and a sacrificial layer over the layered structure on a side opposite the first substrate; and
   separating the first substrate from the layered structure after the second substrate is attached; and
   removing the second layer after the first substrate is separated, wherein the first layer of the layered structure and the second substrate constitute the thin film structure;
   wherein separating the first substrate from the layered structure comprises separating the first substrate and the sacrificial layer from the buffer layer via laser irradiation, wherein the laser irradiation is shone through the first substrate and absorbed by the sacrificial layer.

2. The method of claim 1, further comprising:
   providing a third substrate over a surface of the thin film structure opposite the second substrate; and
   removing the second substrate from the thin film structure.

3. The method of claim 1, wherein the sacrificial layer is at least one of capable of absorbing irradiated light and of a high decomposition temperature.

4. The method of claim 1, wherein the second substrate is provided with a bonding layer.

5. The method of claim 1, wherein separating the first substrate from the layered structure comprises separating the first substrate by decomposition of the sacrificial layer.

6. A method of producing an inverted semiconductor structure, comprising:
   providing a layered structure on a first substrate, the layered structure comprising a semiconductor layer, a sacrificial layer, a buffer layer, an etch-stop layer, a first dielectric layer, a second dielectric layer and a first electrode;
   providing a second substrate over the layered structure on a side opposite the first substrate;
   separating the first substrate from the layered structure after the second substrate is attached;
   removing the buffer layer, the first dielectric layer, and the etch-stop layer after the first substrate is separated; and
   providing a second electrode and a third electrode over the remaining layers of the layered structure.

7. The method of claim 6, wherein the remaining layers of the layered structure are inverted prior to providing the second electrode and the third electrode.

8. The method of claim 6, wherein providing the layered structure on the first substrate comprises:
   providing the sacrificial layer over the first substrate;
   providing the buffer layer over the sacrificial layer;
   providing the etch-stop layer over the buffer layer;
   providing the first dielectric layer over the etch-stop layer; and
   providing the silicon layer over the first dielectric layer.

9. The method of claim 8, further comprising:
   recrystallizing the silicon layer;
   providing a second dielectric layer over the silicon layer;
   providing a patterned metal layer over the second dielectric layer, the patterned metal layer defining at least a gate electrode;
   defining at least a source region and at least a drain region in the second dielectric layer on each side of the gate electrode; and
   annealing the layered structure.

10. The method of claim 7, further comprising:
   patterning a photoresist over the remaining layers of the layered structure to self-align source and drain contact vias with the gate electrode;
   creating a vias to expose source and drain regions of the silicon layer;
   removing the patterned photoresist; and providing a source electrode and a drain electrode over at least a portion of the source region and over at least a portion of the drain region respectively.

11. The method of claim 6, wherein the sacrificial layer comprises at least one of amorphous silicon, indium-tin oxide, phosphorous-doped amorphous silicon, gallium nitride, zinc oxide and lead-zirconium titanate.

12. The method of claim 10, wherein creating the vias is performed by etching.

13. The method of claim 6, wherein the second substrate is provided with a bonding layer.

14. The method of claim 6, wherein separating the first substrate from the layered structure comprises separating the first substrate via decomposition of the sacrificial layer.

15. The method of claim 8, further comprising:
recrystallizing the silicon layer;
providing a second dielectric layer over the silicon layer;
providing a patterned metal layer over the second dielectric layer, the patterned metal layer defining at least a gate electrode; and
annealing the layered structure.

16. The method of claim 7, further comprising:
patterning a photoresist to self-align source and drain contact vias with the gate electrode;
etching exposed areas of the device structure to define source and drain regions and exposing the silicon layer;
removing the patterned photoresist;
providing a doping layer over the exposed silicon layer to define a source region and a drain region;
annealing the doping layer; and
providing a source electrode and a drain electrode over at least a portion of the source region and over at least a portion of the drain region respectively.

17. The method of claim 15, wherein the silicon layer is recrystallized via laser annealing.

18. The method of claim 15, wherein the sacrificial layer comprises at least one of amorphous silicon, indium-tin oxide, phosphorous-doped amorphous silicon, gallium nitride, zinc oxide and lead-zirconium titanate.

19. The method of claim 8, further comprising:
annealing the silicon layer;
providing a second dielectric layer over the silicon layer; and
providing a bonding layer over the second dielectric layer.

20. The method of claim 6, wherein providing the second substrate over the layered structure comprises:
providing the second substrate over the bonding layer.

21. The method of claim 6, wherein separating the first substrate from the layered structure comprises:
removing the buffer layer and the etch-stop layer after performing laser irradiation of the first substrate and the sacrificial layer and after removing the first substrate and the sacrificial layer; and
performing laser recrystallization of the semiconductor layer.

22. The method of claim 7, further comprising:
patterning self-align source and drain vias self aligned to a gate electrode;
etching the vias to expose source and drain regions of the silicon layer;
defining a source region and an drain region on the silicon layer;
providing a source electrode and a drain electrode over the source region and the drain region respectively; and
performing a low-temperature de-hydrogenation step.

23. The method of claim 19, wherein the sacrificial layer comprises at least one of amorphous silicon, indium-tin oxide, phosphorous-doped amorphous silicon, gallium nitride, zinc oxide, and lead-zirconium titanate.

24. The method of claim 19, wherein the second substrate is provided with a bonding layer.

* * * * *